US010308131B1

(12) United States Patent
Bartlett et al.

(10) Patent No.: US 10,308,131 B1
(45) Date of Patent: Jun. 4, 2019

(54) COURTESY HAND-OFF VISUAL INDICATORS FOR PUBLIC ELECTRIFIED VEHICLE CHARGING

(71) Applicant: FORD GLOBAL TECHNOLOGIES, LLC, Dearborn, MI (US)

(72) Inventors: Alexander Bartlett, Wyandotte, MI (US); Dylan Erb, Allen Park, MI (US); Jacob Wiles, Plymouth, MI (US); Bikram Singh, Royal Oak, MI (US); Baocheng Sun, Beverly Hills, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/873,949

(22) Filed: Jan. 18, 2018

(51) Int. Cl.
*B60L 11/18* (2006.01)
*B60L 3/04* (2006.01)
*H02J 7/00* (2006.01)
*G01R 31/371* (2019.01)

(52) U.S. Cl.
CPC ............ *B60L 11/1861* (2013.01); *B60L 3/04* (2013.01); *B60L 11/1818* (2013.01); *B60L 11/1846* (2013.01); *B60L 11/1877* (2013.01); *G01R 31/371* (2019.01); *H02J 7/0042* (2013.01); *H02J 7/0047* (2013.01)

(58) Field of Classification Search
CPC ............ B60L 11/1861; B60L 11/1818; B60L 11/1846; B60L 11/1877; B60L 3/04; B60L 58/12; H02J 7/0042; H02J 7/0047; G01R 31/371
See application file for complete search history.

(56) References Cited

U.S. PATENT DOCUMENTS

| 5,614,808 | A | 3/1997 | Konoya et al. |
| 8,125,324 | B2 | 2/2012 | Frey et al. |
| 8,179,245 | B2 | 5/2012 | Chander et al. |
| 9,352,659 | B1 | 5/2016 | Turner |
| 9,387,771 | B1 | 7/2016 | Shekher |
| 9,457,682 | B2 | 10/2016 | Twarog et al. |
| 2015/0077239 | A1* | 3/2015 | Litjen ............... B60L 11/1818 340/455 |
| 2017/0240060 | A1 | 8/2017 | Roberts et al. |

* cited by examiner

*Primary Examiner* — Leon Flores
(74) *Attorney, Agent, or Firm* — Carlson, Gaskey & Olds (57) ABSTRACT

A charging system for an electrified vehicle includes a battery pack, a charging component in charging connection with the battery pack, a visual indicator on the charging component, and a control module configured to illuminate the visual indicator in response to reaching a predefined state of charge (SOC) threshold of the battery pack. The visual indicator can indicate that the SOC of the battery pack has reached a level that is acceptable for unplugging the electrified vehicle from a charging station.

25 Claims, 6 Drawing Sheets

COURTESY HAND-OFF VISUAL INDICATORS FOR PUBLIC ELECTRIFIED VEHICLE CHARGING

TECHNICAL FIELD

This disclosure relates to vehicle charging systems equipped with visual indicators that facilitate courtesy hand-offs of charging station components from one electrified vehicle user to another electrified vehicle user who is waiting to charge.

BACKGROUND

The desire to reduce automotive fuel consumption and emissions is well documented. Therefore, vehicles are being developed that reduce or completely eliminate reliance on internal combustion engines. Electrified vehicles are currently being developed for this purpose. In general, electrified vehicles differ from conventional motor vehicles because they are selectively driven by one or more battery powered electric machines. Conventional motor vehicles, by contrast, rely exclusively on the internal combustion engine to propel the vehicle.

A charging system typically connects an electrified vehicle to an external power source, such as a wall outlet or a charging station, for charging the battery pack of the vehicle. Plug-in hybrid electric vehicles and battery electric vehicles, for example, include a vehicle inlet assembly having ports for receiving a connector from the charging station.

An electrified vehicle user may encounter situations in which he/she arrives at a public charging station that is already being used by another electrified vehicle user. It may be desirable for the electrified vehicle user to ascertain whether the other vehicle has either completed charging or received a sufficient amount of charge to permit the connector to be unplugged from the other vehicle and then connected to the user's own vehicle for charging.

SUMMARY

A charging system for an electrified vehicle according to an exemplary aspect of the present disclosure includes, among other things, a battery pack, a charging component in charging connection with the battery pack, a visual indicator on the charging component, and a control module configured to illuminate the visual indicator in response to reaching a predefined state of charge (SOC) threshold of the battery pack.

In a further non-limiting embodiment of the foregoing charging system, the charging component is a vehicle inlet assembly.

In a further non-limiting embodiment of either of the foregoing charging systems, the visual indicator is mounted within a housing of the vehicle inlet assembly.

In a further non-limiting embodiment of any of the foregoing charging systems, the visual indicator includes an insert and a light source.

In a further non-limiting embodiment of any of the foregoing charging systems, the insert is mounted within a housing of the charging component and the light source is positioned behind the insert.

In a further non-limiting embodiment of any of the foregoing charging systems, the light source includes a light emitting diode (LED).

In a further non-limiting embodiment of any of the foregoing charging systems, the control module is configured to actuate the light source to illuminate the insert.

In a further non-limiting embodiment of any of the foregoing charging systems, the visual indicator includes a pictogram, a word, or both.

In a further non-limiting embodiment of any of the foregoing charging systems, the visual indicator indicates that the SOC of the battery pack has reached a level that is acceptable to a user of the electrified vehicle.

In a further non-limiting embodiment of any of the foregoing charging systems, the visual indicator indicates that it is acceptable to unplug the electrified vehicle from a charging station.

In a further non-limiting embodiment of any of the foregoing charging systems, the predefined SOC threshold of the battery pack is input by a user of the electrified vehicle.

In a further non-limiting embodiment of any of the foregoing charging systems, the predefined SOC threshold is input on a human machine interface of the electrified vehicle.

In a further non-limiting embodiment of any of the foregoing charging systems, the visual indicator is located near a charging port of the charging component.

A method according to another exemplary aspect of the present disclosure includes, among other things, automatically illuminating a visual indicator of a charging component of an electrified vehicle in response to reaching a predefined minimum state of charge (SOC) threshold when charging a battery pack. The visual indicator indicates that the SOC of the battery pack has reached a level that is acceptable for unplugging the electrified vehicle from a charging station.

In a further non-limiting embodiment of the foregoing method, the method includes determining whether a user has input the predefined minimum SOC threshold.

In a further non-limiting embodiment of either of the foregoing methods, the method includes setting a default value of 100% SOC if the user has not input the predefined minimum SOC value.

In a further non-limiting embodiment of any of the foregoing methods, automatically illuminating the visual indicator includes illuminating a pictogram.

In a further non-limiting embodiment of any of the foregoing methods, automatically illuminating the visual indicator includes illuminating a word.

In a further non-limiting embodiment of any of the foregoing methods, automatically illuminating the visual indicator includes illuminating a pictogram and a word.

In a further non-limiting embodiment of any of the foregoing methods, the predefined minimum SOC threshold is a user defined value that is less than 100% SOC.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure describes exemplary electrified vehicle charging systems for charging energy storage devices (e.g., battery packs). An exemplary charging system includes a visual indicator that can be automatically illuminated once the battery pack has been charged to a predefined minimum state of charge (SOC) threshold. The visual indicator may include a pictogram, text, or both for communicating messages to other electrified vehicle users. Once illuminated, the visual indicator provides an intuitive indication to the other vehicle users that the electrified vehicle that is currently on-plug has received a sufficient amount of charge and therefore may be unplugged from a charging station. The visual indicator therefore facilitates a courtesy hand-off of charging station components from one electrified vehicle user to another. These and other features are discussed in greater detail in the following paragraphs of this detailed description.

Figure 1:
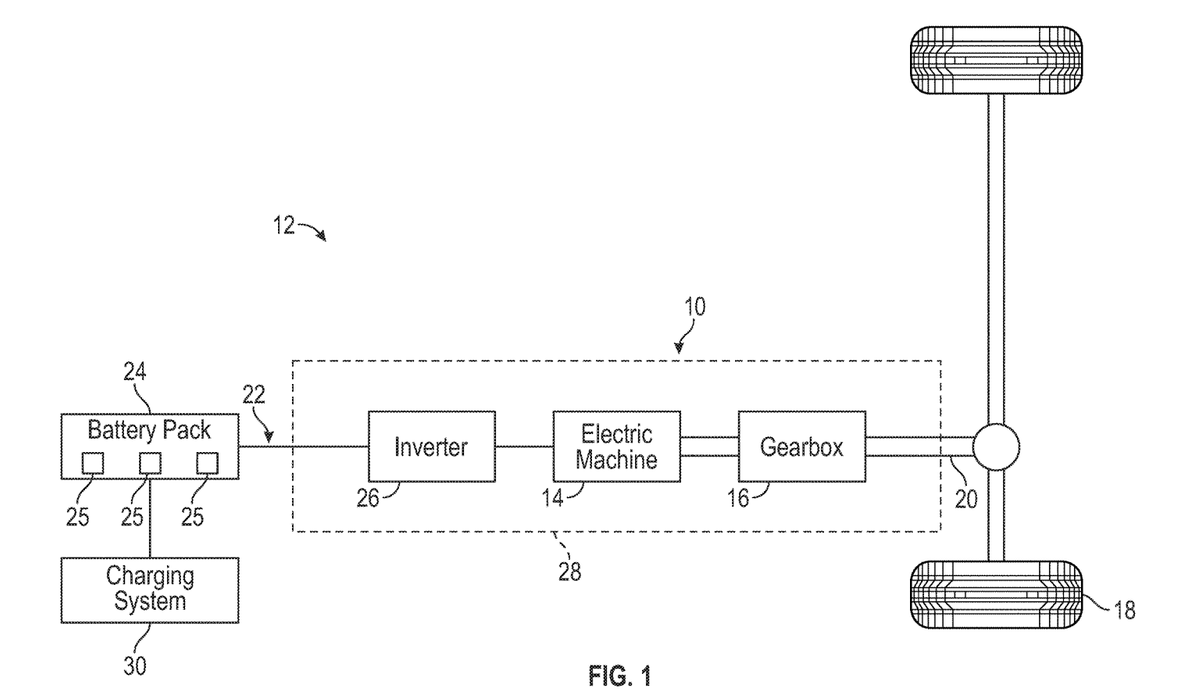
FIG. 1 schematically illustrates a powertrain of an electrified vehicle.

FIG. 1 schematically illustrates a powertrain 10 of an electrified vehicle 12. The electrified vehicle 12 may be a battery electric vehicle (BEV) or a plug-in hybrid electric vehicle (PHEV), for example. Therefore, although not shown in this embodiment, the electrified vehicle 12 could be equipped with an internal combustion engine that can be employed either alone or in combination with other energy sources to propel the electrified vehicle 12.

In the illustrated embodiment, the electrified vehicle 12 is a full electric vehicle propelled solely through electric power, such as by an electric machine 14, without any assistance from an internal combustion engine. The electric machine 14 may operate as an electric motor, an electric generator, or both. The electric machine 14 receives electrical power and provides a rotational output power. The electric machine 14 may be connected to a gearbox 16 for adjusting the output torque and speed of the electric machine 14 by a predetermined gear ratio. The gearbox 16 is connected to a set of drive wheels 18 by an output shaft 20. A voltage bus 22 electrically connects the electric machine 14 to a battery pack 24 through an inverter 26. The electric machine 14, the gearbox 16, and the inverter 26 may be collectively referred to as a transmission 28.

The battery pack 24 is an exemplary electrified vehicle battery. The battery pack 24 may be a high voltage traction battery pack that includes a plurality of battery assemblies 25 (i.e., battery arrays or groupings of battery cells) capable of outputting electrical power to operate the electric machine 14 and/or other electrical loads of the electrified vehicle 12. Other types of energy storage devices and/or output devices can also be used to electrically power the electrified vehicle 12.

The electrified vehicle 12 is also be equipped with a charging system 30 for charging the energy storage devices (e.g., battery cells) of the battery pack 24. As described in greater detail below, the charging system 30 may include charging components that are located both onboard the electrified vehicle 12 and external to the electrified vehicle 12. The charging system 30 can be connected to an external power source for receiving and distributing power received from the external power source throughout the electrified vehicle 12.

The powertrain 10 of FIG. 1 is highly schematic and is not intended to limit this disclosure. Various additional components could alternatively or additionally be employed by the powertrain 10 within the scope of this disclosure. In addition, the teachings of this disclosure may be incorporated into any type of electrified vehicle, including but not limited to cars, trucks, sport utility vehicles, boats, planes, etc.

Figure 2:
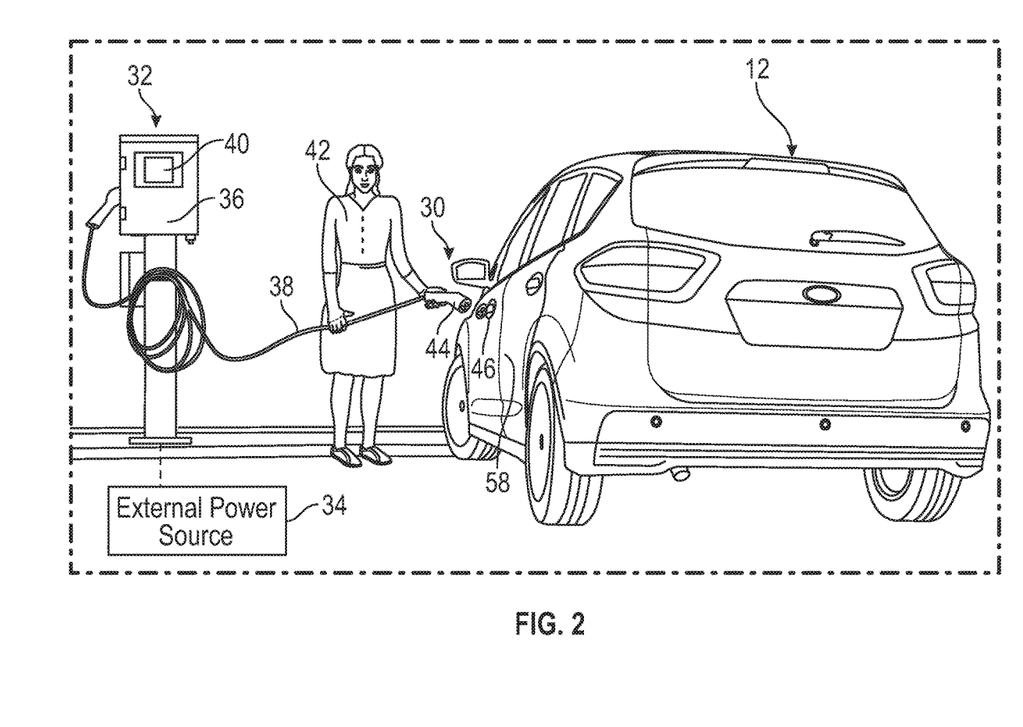
FIG. 2 schematically illustrates an electrified vehicle while being charged at a charging station.

FIG. 2 illustrates an electrified vehicle 12 parked near a charging station 32 for charging. The electrified vehicle 12 may employ the powertrain 10 shown in FIG. 1 or any similar electrified powertrain.

The charging station 32 is powered by an external power source 34 (shown schematically). In an embodiment, the external power source 34 includes utility grid power. In another embodiment, the external power source 34 includes an alternative energy source, such as solar power, wind power, etc. In yet another embodiment, the external power source 34 includes a combination of utility grid power and alternative energy sources.

The charging station 32 may include, among other things, a housing 36 and a charge cord 38. In general, the housing 36 houses the various internal components of the charging station 32. The size, shape, and configuration of the housing 36 is not intended to limit this disclosure. The housing 36 may additionally include an output display 40 for displaying information to a user 42 of the electrified vehicle 12.

Figure 3:
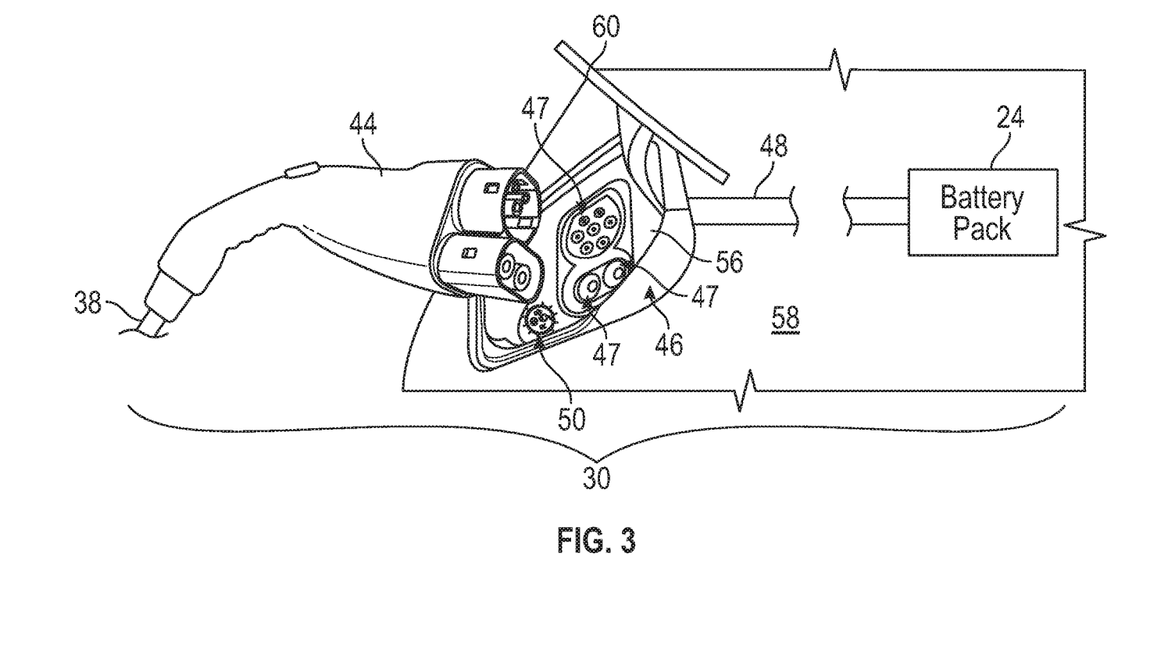
FIG. 3 illustrates an exemplary charging system for charging an electrified vehicle.

Referring now to FIGS. 2 and 3, the charge cord 38 may extend outside of the housing 36 for connecting to the electrified vehicle 12. For example, the charge cord 38 may include a charge connector 44 that is configured to connect to a vehicle inlet assembly 46 of the electrified vehicle 12. The vehicle inlet assembly 46 includes a plurality of ports 47 that each include a mating terminal for carrying current during charging events. Power originating from the external power source 34 may be transferred from the charging station 32 to the vehicle inlet assembly 46 for charging the battery pack 24 of the electrified vehicle 12 via the charge connector 44 that is attached to the charge cord 38. One or more high voltage cables 48 connect between the vehicle inlet assembly 46 and the battery pack 24 for transferring the power received by the vehicle inlet assembly 46 to the battery pack 24 for replenishing the energy of the battery cells of the battery pack 24.

The charging system 30 may include a multitude of charging components. In an embodiment, the charge cord 38, the charge connector 44, the vehicle inlet assembly 46, the high voltage cable 48, and the battery pack 24 make up the charging system 30 of the electrified vehicle 12. Thus, the charging system 30 can include components that are located both onboard and external to the electrified vehicle 12. The charging system 30 may be configured to deliver power to the battery pack 24 using any type of charging (e.g., AC, DC, etc.).

In some instances, the user 42 may venture away from the electrified vehicle 12 during the charging event. During the absence of the user 42, a driver/user of another electrified vehicle may arrive at the charging station 32. It may be desirable for the driver of this other electrified vehicle to ascertain whether the electrified vehicle 12 has been charged up to a desired state of charge before unplugging the charge connector 44 from the vehicle inlet assembly 46 of the electrified vehicle 12 and connecting it to a vehicle inlet assembly of the driver's own vehicle. The charging system 30 may therefore be equipped with a visual indicator 50 for providing notice to the user that charging has completed and that it is acceptable to unplug the charge connector 44 from the vehicle inlet assembly 46 of the electrified vehicle 12. Exemplary visual indicators that are suitable for facilitating this type of courtesy hand-off are discussed in further detail below.

Figure 4:
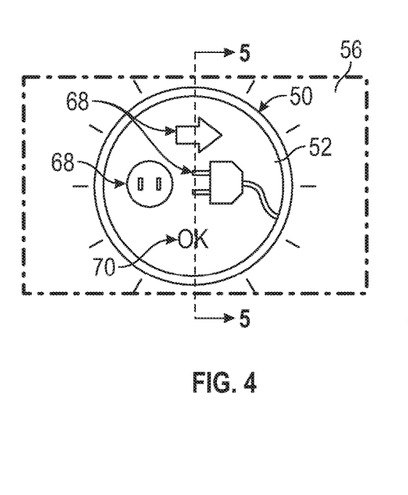
FIG. 4 is a blown up view of a visual indicator of the charging system of FIG. 3 according to a first embodiment of this disclosure.
Figure 5:
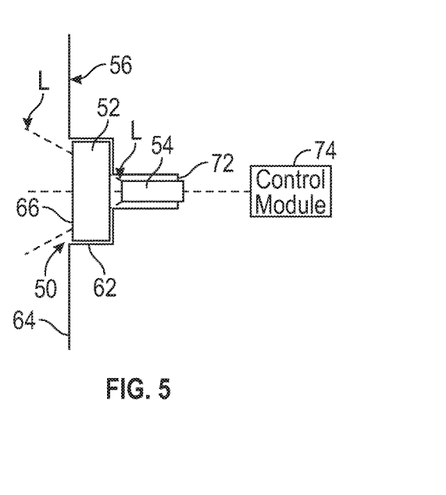
FIG. 5 is a cross sectional view through section A-A of the visual indicator of FIG. 4.

FIGS. 4-5, with continued reference to FIGS. 1-3, illustrate an exemplary visual indicator 50 of the charging system 30. In an embodiment, the visual indicator 50 includes an insert 52 and a light source 54.

The insert 52 may be mounted relative to any charging component of the charging system 30 for providing an intuitive indication of the charging status of the electrified vehicle 12. In an embodiment, the insert 52 is mounted within a housing 56 of the vehicle inlet assembly 46. The housing 56 is permanently mounted to a vehicle body 58 (see FIGS. 2 and 3). The insert 52 may be mounted at a location near the ports 47 that is easily visible when a door 60 (see FIG. 3) of the vehicle inlet assembly 46 is moved to an open position. The size, shape, and material make-up of the insert 52 are not intended to limit this disclosure. The insert 52 may be positioned within an opening 62 formed in an outer face 64 of the housing 56 such that an outer surface 66 of the insert 52 sits flush with the outer face 64. However, other mounting configurations are also contemplated within the scope of this disclosure.

A plurality of markings may be provided on the insert 52 for communicating charging status messages to electrified vehicle users. The markings may be formed on or in the insert 52 using a variety of techniques that are in no way intended to limit this disclosure. In an embodiment, the markings indicate a 'charge complete' message for alerting electrified vehicle users that it is acceptable to unplug the charge connector 44 from the vehicle inlet assembly 46 and then use the charge connector 44 to charge their own vehicle.

Figure 6:
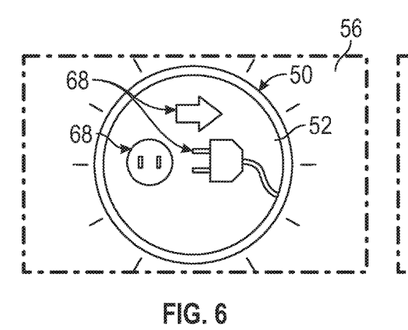
FIGS. 6 and 7 illustrate visual indicators according to additional embodiments of this disclosure.
Figure 7:
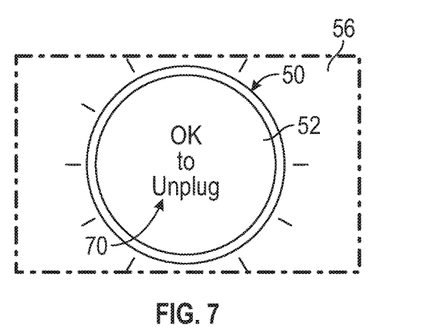

In a first embodiment, the insert 52 includes a combination of pictograms 68 and words 70 for communicating the charge complete message to the electrified vehicle users. In a second embodiment, the insert 52 includes only pictograms 68 for displaying the charge complete message (see FIG. 6). In a third embodiment, the insert 52 includes only words 70 for communicating the charge complete message (see FIG. 7). The pictograms 68 and words 70 shown in FIGS. 4, 6, and 7 are intended as non-limiting examples, and it should be understood that various other markings could be used within the scope of this disclosure.

The light source 54 may be positioned behind the insert 52, such as near an inner face 72 of the housing 56, and is configured to emit light L for selectively illuminating the insert 52, including the pictograms 68 and/or words 70 of the insert 52. In an embodiment, the light source 54 is a light emitting diode (LED). However, other light sources could also be utilized within the scope of this disclosure. In addition, although only a single light source 54 is shown, it should be understood that the visual indicator 50 could incorporate additional light sources.

The light source 54 may be controlled by a control module 74. The control module 74 includes a processor and memory and can be programmed with instructions for controlling when to illuminate the visual indicator 50 for displaying its included message. For example, the control module 74 may control the light source 54 so that it emits light only when the battery pack 24 has been charged to a minimum state of charge (SOC) threshold. In other words, the light source 54 can be turned ON when the SOC of the battery pack 24 is at or above a minimum SOC threshold and can be turned OFF when the SOC of the battery pack 24 is below the minimum SOC threshold.

Figure 8:
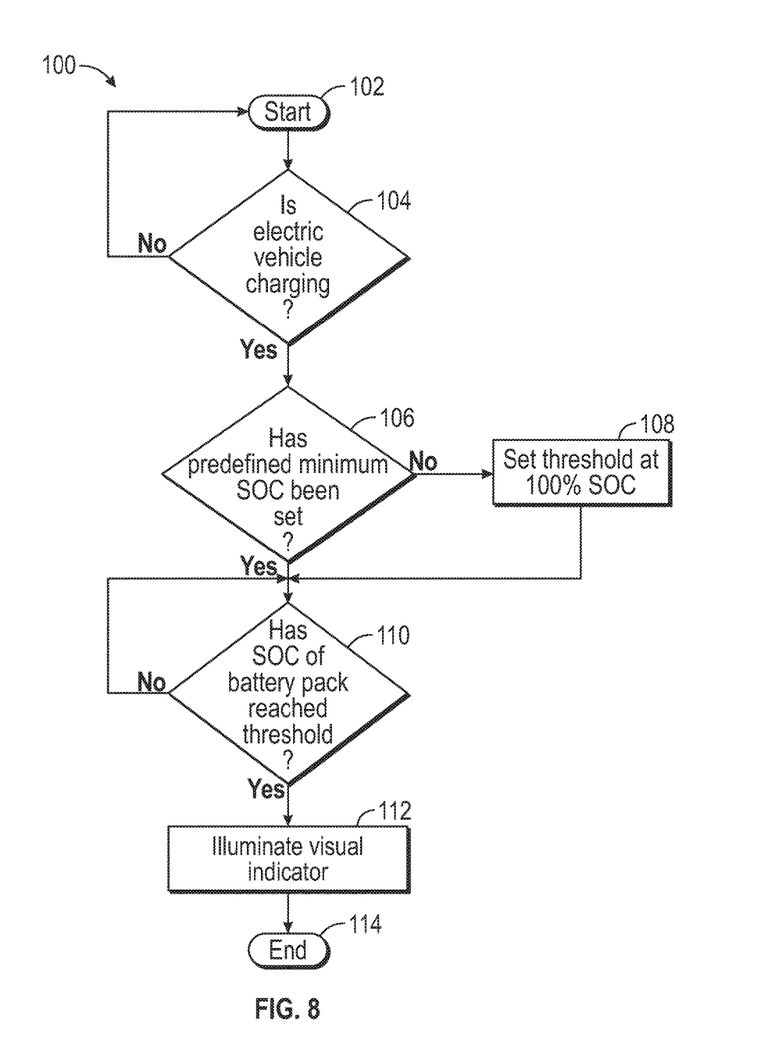
FIG. 8 schematically illustrates a method of illuminating a visual indicator of a vehicle charging system for facilitating a courtesy hand-off of charging station equipment from one electrified vehicle to another.

FIG. 8, with continued reference to FIGS. 1-7, schematically illustrates a method 100 for controlling the visual indicator 50. In an embodiment, the control module 74 is programmed with one or more algorithms adapted to execute the exemplary method 100.

The exemplary method 100 begins at block 102. At block 104, the control module 74 monitors whether the electrified vehicle 12 is charging. For example, the control module 74 may receive a plug connection signal in response to the user 42 plugging the charge connector 44 into the vehicle inlet assembly 46. If block 104 returns a YES flag, the method 100 proceeds to block 106. Alternatively, if a NO flag is returned, the method 100 returns to block 102.

At block 106, the control module 74 monitors whether the user 42 has set a predefined minimum SOC threshold for charging the battery pack 24. The predefined minimum SOC threshold represents the minimum SOC of the battery pack 24 that must be achieved during the charging event before illuminating the visual indicator 50. Therefore, the predefined minimum SOC threshold sets the threshold at which the user 42 will allow another user to unplug the charge connector 44 from the vehicle inlet assembly 46.

Figure 9:
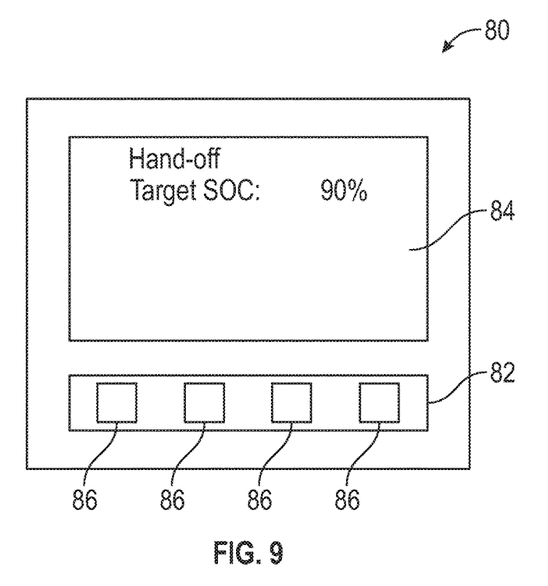
FIG. 9 illustrates an exemplary human machine interface of an electrified vehicle.

In an embodiment, the predefined minimum SOC threshold is set by the user 42 using a human machine interface 80 (see, for example, FIG. 9) located within a passenger cabin of the electrified vehicle 12. The human machine interface 80 may include a user input 82 and a display 84, both of which are shown schematically in FIG. 9. The user input 82 may include a touchscreen and/or series of tactile buttons 86 for entering information. The display 84 may include a touchscreen and/or series of gauges for displaying information to the driver. In another non-limiting embodiment, the human machine interface 80 is part of an in-dash infotainment system of the electrified vehicle 12. The predefined minimum SOC threshold could alternatively be set by the user 42 using a mobile device that is configured to execute the instructions of one or more mobile applications (e.g., MyFord® Mobile) for communicating information to the control module 74. If the predefined minimum SOC threshold has not been set, the control module 74 sets a default value of 100% SOC at block 108.

Next, at block 110, the control module 74 monitors whether the current SOC of the battery pack 24 has reached the predefined minimum SOC threshold. If YES, the visual indicator 50 is illuminated by actuating the light source 54 at block 112. Once illuminated, the visual indicator 50 indicates to other electrified vehicle users that the user 42 considers charging to be complete and will permit the other users to unplug the electrified vehicle 12 from the charging station 32. The method 100 then ends at block 114.

The visual indicators of this disclosure provide intuitive indications of "charge complete" messages with clear visual indicators that can take the form of pictograms, text, or both. The visual indicators therefore facilitate courtesy hand-offs to other electrified vehicle users who are waiting to charge their own vehicles. The courtesy hand-off can occur prior to a 100% SOC if the user does not require a full charge, thereby facilitating a smoother, less frustrating user charging experience.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A charging system for an electrified vehicle, comprising:
    a battery pack;
    a charging component located onboard the electrified vehicle and being in charging connection with the battery pack;
    a visual indicator on the charging component; and
    a control module configured to illuminate the visual indicator in response to reaching a predefined state of charge (SOC) threshold of the battery pack.

2. The charging system as recited in claim 1, wherein the charging component is a vehicle inlet assembly.

3. The charging system as recited in claim 2, wherein the visual indicator is mounted within a housing of the vehicle inlet assembly.

4. The charging system as recited in claim 1, wherein the visual indicator includes an insert and a light source.

5. The charging system as recited in claim 4, wherein the insert is mounted within a housing of the charging component and the light source is positioned behind the insert.

6. The charging system as recited in claim 4, wherein the light source includes a light emitting diode (LED).

7. The charging system as recited in claim 4, wherein the control module is configured to actuate the light source to illuminate the insert.

8. The charging system as recited in claim 1, wherein the visual indicator includes a pictogram, a word, or both.

9. The charging system as recited in claim 1, wherein the visual indicator indicates that the SOC of the battery pack has reached a level that is acceptable to a user of the electrified vehicle.

10. The charging system as recited in claim 9, wherein the visual indicator indicates that it is acceptable to unplug the electrified vehicle from a charging station.

11. The charging system as recited in claim 1, wherein the predefined SOC threshold of the battery pack is input by a user of the electrified vehicle.

12. The charging system as recited in claim 11, wherein the predefined SOC threshold is input on a human machine interface of the electrified vehicle.

13. The charging system as recited in claim 1, wherein the visual indicator is located near a charging port of the charging component.

14. A method, comprising:
    automatically illuminating a visual indicator of a charging component located onboard an electrified vehicle in response to reaching a predefined minimum state of charge (SOC) threshold when charging a battery pack, wherein the visual indicator indicates that the SOC of the battery pack has reached a level that is acceptable for unplugging the electrified vehicle from a charging station.

15. The method as recited in claim 14, comprising determining whether a user has input the predefined minimum SOC threshold.

16. The method as recited in claim 14, wherein automatically illuminating the visual indicator includes illuminating a pictogram.

17. The method as recited in claim 14, wherein automatically illuminating the visual indicator includes illuminating a word.

18. The method as recited in claim 14, wherein automatically illuminating the visual indicator includes illuminating a pictogram and a word.

19. The method as recited in claim 14, wherein the predefined minimum SOC threshold is a user defined value that is less than 100% SOC.

20. The method as recited in claim 14, wherein the charging station includes a housing and an output display, and the charging component that includes the visual indicator is completely separate from either the housing or the output display.

21. The charging system as recited in claim 1, wherein the charging component is configured to receive a charge connector of a charge cord.

22. The charging system as recited in claim 1, comprising a high voltage cable connecting between the charging component and the battery pack.

23. The charging system as recited in claim 1, wherein a housing of the charging component is permanently mounted to a vehicle body of the electrified vehicle.

24. The charging system as recited in claim 1, wherein the charging component includes a door movable between a closed position and an open position, wherein the visual indicator is exposed for viewing when the door is in the open position.

25. A method, comprising:
    automatically illuminating a visual indicator of a charging component of an electrified vehicle in response to reaching a predefined minimum state of charge (SOC) threshold when charging a battery pack, wherein the visual indicator indicates that the SOC of the battery pack has reached a level that is acceptable for unplugging the electrified vehicle from a charging station;
    determining whether a user has input the predefined minimum SOC threshold; and
    setting a default value of 100% SOC if the user has not input the predefined minimum SOC value.

* * * * *